US010872191B1

(12) United States Patent
Pikus et al.

(10) Patent No.: US 10,872,191 B1
(45) Date of Patent: Dec. 22, 2020

(54) INVARIANT PROPERTY-BASED CLUSTERING OF CIRCUIT IMAGES FOR ELECTRONIC DESIGN AUTOMATION (EDA) APPLICATIONS

(71) Applicant: Mentor Graphics Corporation, Wilsonville, OR (US)

(72) Inventors: Fedor G. Pikus, Beaverton, OR (US); Muhammad Shahir Rahman, Portland, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 16/829,827

(22) Filed: Mar. 25, 2020

(51) Int. Cl.
*G06F 30/392* (2020.01)
*G03F 7/20* (2006.01)
*G06F 30/32* (2020.01)

(52) U.S. Cl.
CPC ........ *G06F 30/392* (2020.01); *G03F 7/70433* (2013.01); *G06F 30/32* (2020.01)

(58) Field of Classification Search
CPC ..... G06F 30/392; G06F 30/32; G03F 7/70433
USPC .......................................................... 716/55
See application file for complete search history.

(56) References Cited

U.S. PATENT DOCUMENTS

| 10,628,546 | B1* | 4/2020 | Colwell | G06N 20/20 |
|---|---|---|---|---|
| 10,699,051 | B1* | 6/2020 | Zhang | G06N 20/00 |
| 2018/0307792 | A1* | 10/2018 | Kim | G06T 7/0006 |
| 2019/0147134 | A1* | 5/2019 | Wang | G06F 30/20 |
| | | | | 716/52 |

OTHER PUBLICATIONS

Xu Ji, João F. Henriques and Andreas Vedaldi, "Invariant Information Clustering for Unsupervised Image Classification and Segmentation", arXiv:1807.06653v4 [cs.CV] Aug. 22, 2019, pp. 1-10.
Jason Brownlee, "Loss and Loss Functions for Training Deep Learning", Machine Learning Mastery, Jan. 28, 2019, https://machinelearningmastery.com/loss-and-loss-functions-for-training-deep-learning-neural-networks/ , pp. 1-18.

* cited by examiner

*Primary Examiner* — Suresh Memula (57) ABSTRACT

A system may include an image clustering engine and a cluster provision engine. The image clustering image may be configured to access a set of circuit images and cluster the circuit images into different groups via an unsupervised learning process, wherein clustering by the unsupervised learning process is invariant to each invariant property of an invariant property set. A given invariant property in the invariant property set may correspond to a given image transformation, the invariant properties in the invariant property set may be discrete, and the total number of invariant properties in the invariant property set may be finite. The cluster provision engine may be configured to provide the clustered circuit images for further processing or analysis by an electronic design automation (EDA) application.

20 Claims, 6 Drawing Sheets

INVARIANT PROPERTY-BASED CLUSTERING OF CIRCUIT IMAGES FOR ELECTRONIC DESIGN AUTOMATION (EDA) APPLICATIONS

BACKGROUND

Electronic circuits, such as integrated circuits, are used in nearly every facet of modern society from automobiles to microwaves to personal computers. Design of circuits may involve many steps, known as a "design flow." The particular steps of a design flow are often dependent upon the type of microcircuit being designed, its complexity, the design team, and the circuit fabricator or foundry that will manufacture the circuit. Electronic design automation (EDA) applications support the design and verification of circuits prior to fabrication. EDA applications may implement various EDA procedures, e.g., functions, tools, or features to analyze, test, or verify a circuit design at various stages of the design flow.

BRIEF DESCRIPTION OF THE DRAWINGS

Certain examples are described in the following detailed description and in reference to the drawings.

DETAILED DESCRIPTION

Modern integrated circuits continue to increase in complexity, capabilities, and structural density. In designing and analyzing circuits, pattern classifications of circuit portions can provide valuable analytical capabilities to identify hot spot regions, characterize circuit regions, evaluate thermal impacts, and more. Image classification of EDA patterns can be performed via supervised or unsupervised learning techniques, and unsupervised learning can be used to identify dominant differences in circuit images without prior labeling or biasing. Clustering techniques, e.g., via neural networks, can implement machine learning-based classification capabilities to group circuit images for further processing or analysis by EDA applications. One challenge faced in pattern classifications via unsupervised learning is grouping of circuit images with inconsequential differences. For instance, two circuit images may be identical except for a rotated or reflected image orientation, and such images may be, in effect, identical for purposes of EDA analysis techniques (especially as such rotated or reflected image orientations are often times accidental or unintentional). However, conventional unsupervised learning techniques and clustering algorithms may identify such image rotations as dominant image differences, and group such (otherwise identical or similar) circuit images into different groupings, thus reducing the accuracy of EDA circuit analyses or reducing the effectiveness of EDA circuit design flows. That is, conventional unsupervised learning algorithms (e.g., neural networks) may lack the technical capability to be invariant to discrete, finite image differences and may thus be incapable of properly grouping EDA circuit images.

The features described herein may support invariant property-based clustering of circuit images for EDA applications. The invariant clustering features described herein may provide capabilities to cluster circuit images via unsupervised learning that is invariant to a particular set of image properties, referred to herein as invariant properties. Invariant properties may include any image property, change, delta, or transformation by which two images differ from one another. As such, invariant clustering as described herein may be "invariant" to any given invariant property such that difference determinations as part of unsupervised learning pattern classifications and clustering can be independent of, ignore, or unchanged based on image differences corresponding to a given invariant property.

Explained in another way, invariant properties may specify a selected subset of image differences that unsupervised learning algorithms can ignore in classifying circuit images into different groups, such as selected orientation differences or other specified image transformations. As such, invariant clustering as described herein may support pattern clustering of circuit images that are invariant property-independent, allowing for the grouping of circuit images together despite differing by an invariant property and which may be otherwise grouped separately by conventional unsupervised learning and pattern classification processes. Accordingly, the invariant clustering features described herein may increase the accuracy and pattern classifications for circuit images for EDA applications and effectiveness of circuit analyses based on circuit image clusters.

These and other invariant clustering features and technical benefits are described in greater detail herein.

Figure 1:
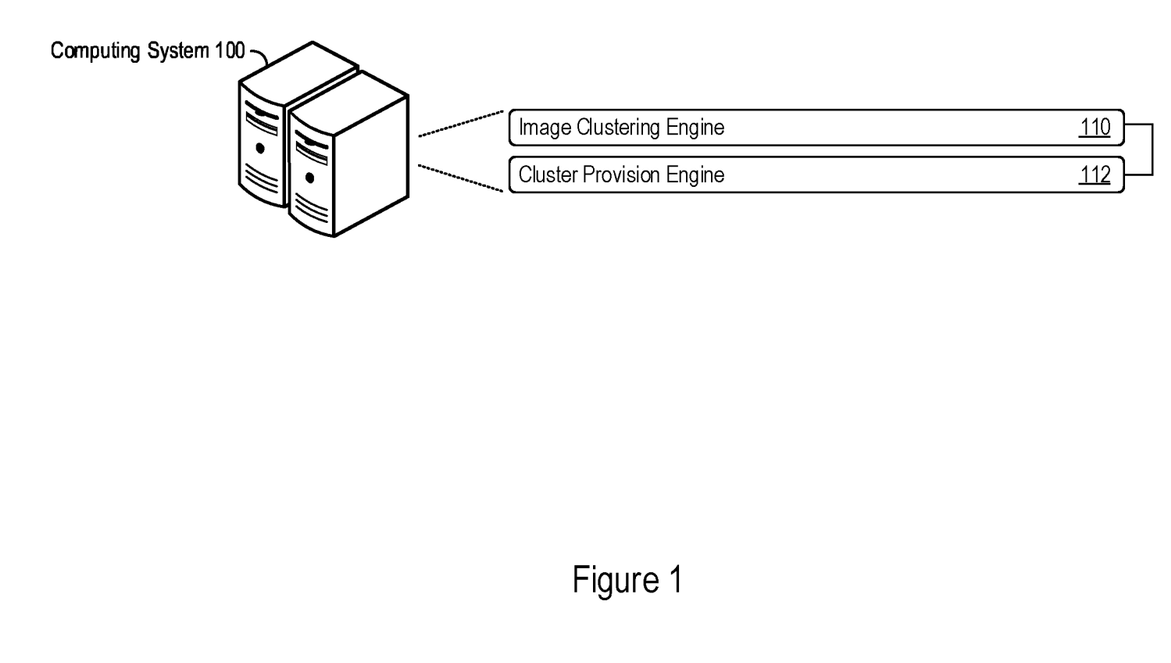
FIG. 1 shows an example of a computing system that supports invariant property-based clustering of circuit images for EDA applications.

FIG. 1 shows an example of a computing system 100 that supports invariant property-based clustering of circuit images for EDA applications. The computing system 100 may include a single or multiple computing devices such as application servers, compute nodes, data servers, desktop or laptop computers, cloud computing resources, smart phones or other mobile devices, tablet devices, embedded controllers, and more. In some implementations, the computing system 100 may be an EDA system that implements, supports, or hosts an EDA application or other EDA-based capabilities. In that regard, the computing system 100 may support pattern classifications for circuit images using clustering and other unsupervised learning techniques.

To implement any of the various features described herein, the computing system 100 may include an image clustering engine 110 and a cluster provision engine 112. The computing system 100 may implement the image clustering engine 110 and cluster provision engine 112 (and components thereof) in various ways, for example as hardware and programming implemented via local resources of the computing system 100. The programming for the engines 108 and 110 may take the form of processor-executable instructions stored on a non-transitory machine-readable storage medium and the hardware for the engines 108 and 110 may include a processor to execute those instructions. A processor may take the form of single processor or multi-processor systems, and in some examples, the computing system 100 implements multiple engine components or system elements using the same computing system features or hardware components (e.g., a common processor or common storage medium for the image clustering engine 110 and the cluster provision engine 112).

In operation, the image clustering engine 110 may access a set of circuit images and cluster the circuit images into different groups via an unsupervised learning process, in which the clustering by the unsupervised learning process may be invariant to each invariant property of an invariant property set. Each given invariant property in the invariant property set may corresponds to a given image transformation respectively. Also, the invariant properties in the invariant property set may be discrete (e.g., definite, distinct, or non-continuous in value) and a total number of invariant properties in the invariant property set may be finite. In operation, the cluster provision engine 112 may provide the clustered circuit images for further processing or analysis by an EDA application.

These and other example invariant clustering features according to the present disclosure are described in greater detail next. While many of the examples used herein are provided in the context of circuit images for EDA applications, any of the disclosed invariant clustering features may be consistently applied to image classifications and/or invariant properties of any type, including outside of the EDA context. Also, some examples of image rotation and image reflection-based invariant properties are described herein, but are provided as illustrative examples. Any type of image differences or image transformations are contemplated herein as possible invariant properties that unsupervised learning algorithms can be invariant to in accordance with the present disclosure.

Figure 2:
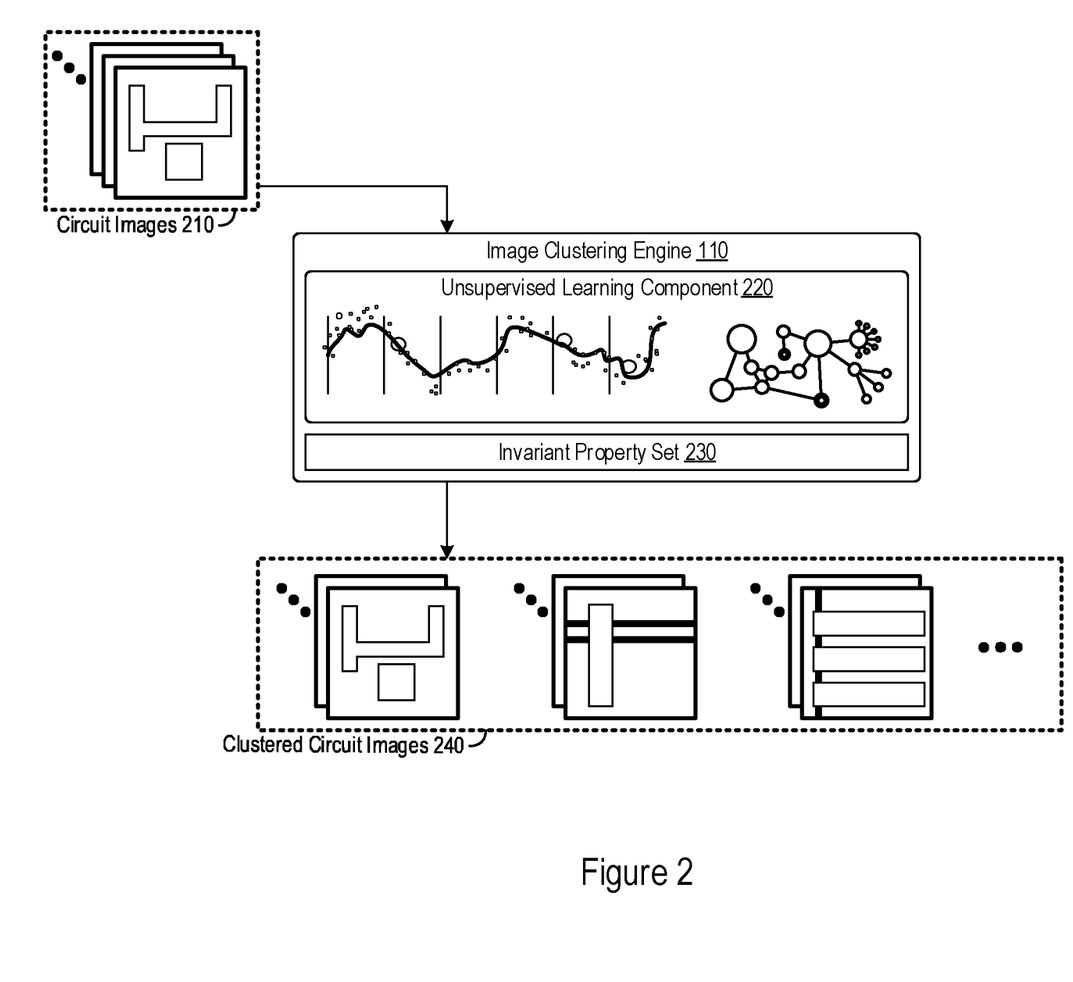
FIG. 2 shows an example of invariant property-based clustering of circuit images by an image clustering engine.

FIG. 2 shows an example of invariant property-based clustering of circuit images by the image clustering engine 110. To support invariant clustering of circuit images, the image clustering engine 110 may access a set of circuit images, such as the circuit images 210 shown in FIG. 2. The circuit images 210 may be provided by user input or accessed from a data store, e.g., as implemented or used by an EDA application.

The circuit images 210 may include any number of images that depict a circuit or selected portions thereof. Accordingly, a circuit image may comprise any digital representation of a circuit or portion thereof, and may come in many different forms (e.g., image formats just as .jpg, .gif, etc., pixel maps in matrix form, as internal representations used by machine-learning components to perform image analyses, and more). Analysis of circuit designs may occur at various points of a design flow, and the circuit images 210 may depict circuit portions and elements at any such stage. For instance, the circuit images 210 may include portions of any circuit design, a logical circuit layout, a physical circuit layout, one or more lithographic masks for manufacture of a circuit layer of a circuit design, a thermal map of a circuit, a printed circuit layout, or circuit images of other forms. In some implementations, the image clustering engine 110 may partition a physical layout, logical layout, thermal graph, lithography mask, or any other circuit design into the circuit images 210. As an illustrative example, the circuit images 210 may partition a circuit design into 1 micron×1 micron sections, with each circuit image depicting a partitioned section of an overall circuit design. As other examples, the circuit images 210 may partition a circuit design into logical sections, e.g., on a transistor-level basis, gate-level basis, hierarchical cell-basis, and the like.

The image clustering engine 110 may cluster the circuit images 210 into groups based on different image characteristics identified and learned from the circuit images 210. To do so, the image clustering engine 110 may apply any number of unsupervised learning techniques to support pattern recognition, image feature learning, and clustering of the circuit images 210. The image clustering engine 110 may itself provide or implement any number of unsupervised learning capabilities, for example through an unsupervised learning component 220 as shown in FIG. 2. In some implementations, the image clustering engine 110 implements the unsupervised learning component 220 as any hardware-software combination (e.g., in a consistent manner as described above with respect to structure and implementation examples of the image clustering engine 110). In other examples, the image clustering engine 110 may remotely access or communicate with a computing system that implements the unsupervised learning component 220 to provide unsupervised learning capabilities.

Through the unsupervised learning component 220, the image clustering engine 110 may cluster the circuit images 210. In particular, the image clustering engine 110 may cluster the circuit images 210 such that the clustering of the circuit images 210 is invariant to any number of invariant properties. The particular set of invariant properties that the unsupervised learning component 220 may be invariant to can be specified as part of an invariant property set 230. The invariant property set 230 may take the form of any explicit or implicit listing of image transformations for unsupervised pattern classifications or image clustering is to be invariant to.

The invariant properties included as part of the invariant property set 230 may provide a discrete and finite set of invariant properties that control how the image clustering engine 110 clusters the circuit images 210. Explained in another way, the image clustering engine 110 may adapt unsupervised learning processes performed by the unsupervised learning component 220 to be invariant to (e.g., unaffected by) the invariant properties specified in the invariant property set 230. As noted herein, a given invariant property of the invariant property set 230 may correspond to a particular image transformation or image difference that the image clustering engine 110 can force the unsupervised learning component 220 to ignore in clustering the circuit images 210. As such, the unsupervised learning component 220 may cluster circuit images according to learned image differences aside from or with an exception of those specified in the invariant property set 230.

Through any of the invariant clustering features described herein, the image clustering engine 110 may classify circuit images into different groups (also referred to as clusters) that are differentiated independent of the invariant properties of the invariant property set 230. In FIG. 2, the image clustering engine 110 generates the clustered circuit images 240, which may include groupings of the circuit images 210 into different clusters according to the invariant clustering performed by the unsupervised learning component 220. The clustered circuit images 240 may be any representation of circuit image clustering, and need not be in the form of cluster indices, specifically annotated cluster IDs, or even include explicitly determined clusters. For instance, the clustered circuit images 240 may be any form of plots (e.g., 2-dimensional graphs) to represent image similarity metrics or represent multi-dimensional image latent vectors, or the clustered circuit images 240 may be in the form of representative images from given image clusters, count values for circuit image clusters, or various other forms. The clustered circuit images 240 may be provided (e.g., by the cluster provision engine 112) for further processing or analysis for EDA circuit designs. For instance, and EDA application may analyze the clustered circuit images 240 to determine design flaws, inefficiencies, thermal hot spots, or other integrated circuit characteristics as part of an EDA design flow. Accordingly, the image clustering engine 110 (as well as the cluster provision engine 112) may support invariant clustering of circuit images for EDA applications.

The invariant clustering features described herein contemplate invariant properties of any type, nature, or characteristic, so long as the invariant properties are discrete (e.g., non-continuous in value) and finite in number. For EDA applications and circuit analyses, specific types of invariant properties may be useful for increasing the accuracy of circuit image clustering, including rotation or reflection-type invariant properties. Various examples of specific invariant clustering features, including for rotation-invariant and reflection-invariant clustering, are described next in connection with FIGS. 3 and 4.

Figure 3:
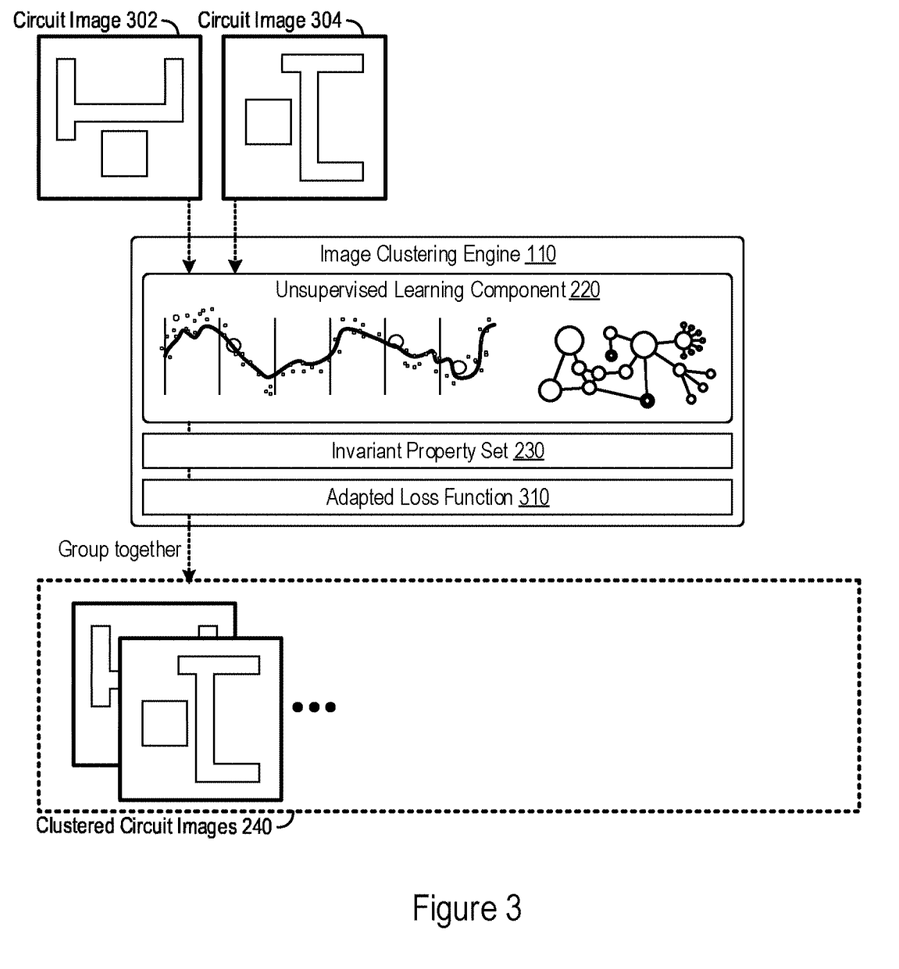
FIG. 3 shows an example of rotation-invariant clustering of circuit images by the image clustering engine.

FIG. 3 shows an example of rotation-invariant clustering of circuit images by the image clustering engine 110. In the example shown in FIG. 3, the image clustering engine 110 generates the clustered circuit images 240, including by clustering the circuit images 302 and 304 depicted in FIG. 3. The circuit images 302 and 304 may be part of a circuit image set, and clustering of the circuit images 302 and 304 may provide an illustrative example of how the image clustering engine 110 may perform a rotation-invariant clustering according to the present disclosure.

To support rotation-invariant clustering, the invariant property set 230 accessed by the image clustering engine 110 may include one or more rotation-based invariant properties. For example, the invariant property set 230 may include a given invariant property that specifies the unsupervised learning component 220 is to be invariant to 90-degree (90°) clockwise rotations in the clustering of circuit images. In operation, the image clustering engine 110 may compare, via the unsupervised learning component 220, the circuit image 302 and the circuit image 304. As an illustrative example, the circuit image 302 may be identical to the circuit image 304 when an image transformation corresponding to one of the invariant properties of the invariant property set is applied to the circuit image 304, in particular through application of a 90° clockwise rotation image transformation. Accordingly, the image clustering engine 110 may ignore the 90° clockwise rotation image difference between the circuit image 302 and 304, and thus group the circuit image 302 and the circuit image 304 into a same group in the clustered circuit images 240.

To support any of the invariant clustering features described herein, the image clustering engine 110 may implement an adapted loss function 310. A loss function (also referred to as an objective function or a cost function) may be any function that numerically or functionally evaluates any aspect, operation, metric, or objective of an unsupervised learning process. As such, loss functions may compute numerical evaluations to evaluate an error state of a neural network model for a current set of weights, a numerical difference measures in comparisons between input images (e.g., a computed difference between input circuit images), and more. Loss function outputs may be referred to herein as cost measurements, and cost measurements may, in some implementations, indicate a difference measure between multiple images as computed by a particular loss function implemented for an unsupervised learning component 220.

The image clustering engine 110 may implement or access any type of standard or conventional loss function to support the invariant clustering described herein, for example as part of the unsupervised learning component 220 in order to implement neural network classifications for clustering of circuit images. In some implementations, the unsupervised learning component 220 provides pattern classification and clustering capabilities through implementation of neural network models to support the invariant clustering features described herein. As part of such an implementation, the image clustering engine 110 may implement or access any number of loss functions to optimize or train neural network models.

The image clustering engine 110 may adapt any standard loss function applied or otherwise implemented by the unsupervised learning component 220 to provide the invariant clustering capabilities described herein. For instance, the adapted loss function 310 may specifically account for each of the invariant properties specified in the invariant property set 230 and, in doing so, output a decreased cost measurement for images that differ by at least one of the image transformations associated with the invariant property set 230. Such a cost measurement may be "decreased" as compared to the output of a standard loss function (without invariant clustering capabilities) as applied to the same images. For clustering algorithms that measure increased image similarity through higher numerical cost measurement values, a "decreased" cost measurement may, in some implements, actually increase the numerical value of the cost measurement. As such, the adapted loss function 310 may differ from conventional loss functions by providing a capability to ignore or reduce the effect of a number of fine, discrete invariant properties.

To provide an illustrative example through FIG. 3, the image clustering engine 110 may apply the adapted loss function 310 to the circuit image 302 and the circuit image 304 as part of comparing the circuit image 302 and the circuit image 304 via an applied unsupervised learning process. The adapted loss function 310 may be configured to compute a cost measurement between circuit images, in some instances as a numerical value that expresses a measured difference between images by a neural network model of the unsupervised learning component 220. The adapted loss function 310 may be configured to output a decreased cost measurement between circuit images that differ (e.g., only) by any of the image transformations corresponding to the invariant properties of the invariant property set 230. As noted herein, the decreased cost measurement may refer to a determined cost measurement by the adapted loss function 310 that is less than that of standard loss function without any invariant clustering capabilities. In the example of FIG. 3, the adapted loss function 310 may output a decreased cost measurement between the circuit images 302 and 304 as these circuit images differ by a 90° clockwise rotation, whereas a standard loss function accounting for the 90° clockwise rotation image difference between the circuit images 302 and 304 would compute a higher cost difference.

While FIG. 3 may depict an example of a decreased cost measurement determined by the adapted loss function 310, the invariant clustering features described herein may additionally or alternatively be understood as configuring a loss function to disregard, ignore, reduce the effect of, or to not account for specific invariant properties in computing cost measurements for unsupervised learning processes (e.g., neural network learning). That is, the adapted loss function 310 may compare the circuit images 302 and 304 for image differences aside from those specified in the invariant property set 230. For circuit images that identical (or near-similar) except for any of the invariant properties in the invariant property set 230, the adapted loss function may determine a cost measurement commensurate with identical or near-similar images. Put another way, the adapted loss function 310 may evaluate image differences between circuit images aside from the invariant properties, e.g., by ignoring the 90° clockwise rotation between the circuit images 302 and 304. In such a way (for this example), the image clustering engine 110 may support 90° clockwise rotation-invariant clustering of circuit images.

To determine a decreased cost measurement for circuit images based on specified invariant properties, the adapted loss function 310 may transform circuit images based on the invariant properties and compute cost measurements for transformed circuit images in order to determine the decreased cost measurement output of the adapted loss function 310. Illustrative examples of such invariant clustering features are presented next in FIG. 4.

Figure 4:
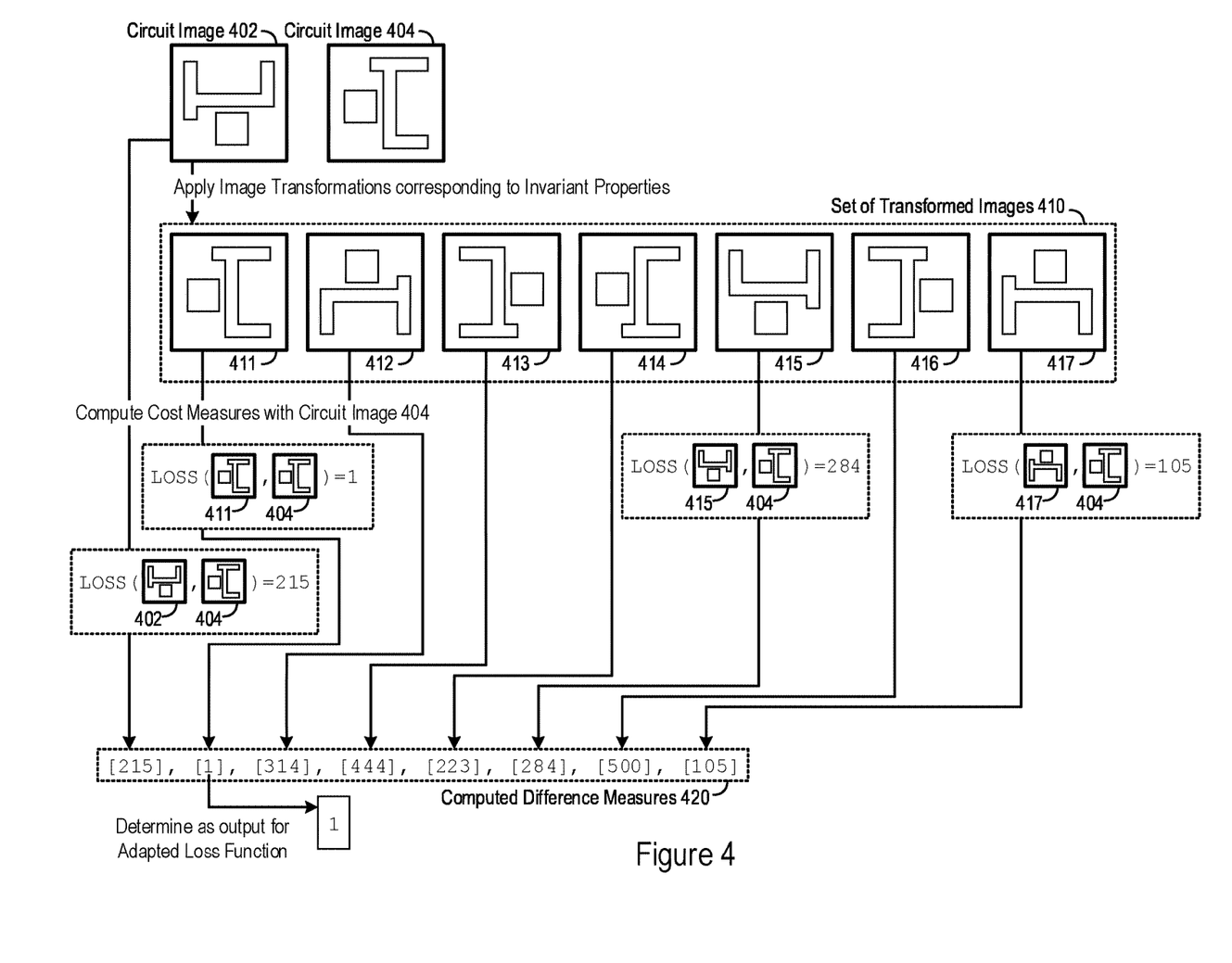
FIG. 4 shows an example comparison between two circuit images by an adapted loss function to support rotation-invariant and reflection-invariant clustering of circuit images.

FIG. 4 shows an example comparison between two circuit images by an adapted loss function to support rotation-invariant and reflection-invariant clustering of circuit images. The example of FIG. 4 may illustrate how the adapted loss function 310 may be applied by the image clustering engine 110 to compare the circuit images 402 and 404 shown in FIG. 4, and the adapted loss function 310 may be invariant to both rotation-based and reflection-based invariant properties as specified in an invariant property set 230.

As an EDA-relevant example illustrated in FIG. 4, the adapted loss function 310 may be configured to be invariant to the following seven (7) invariant properties of an invariant property set 230: a 90-degree image rotation, a 180-degree image rotation, a 270-degree image rotation, a horizontal mirror image, a horizontal mirror image of the 90-degree image rotation, a horizontal mirror image of the 180-degree image rotation, and a horizontal mirror image of the 270-degree image rotation. Note that these invariant properties are discrete (e.g., separate and distinct) and finite in number, and an invariant property set 230 may comprise these invariant properties in EDA-specific context. This may be the case as circuit design elements that differ by 90° rotation and/or reflection image differences may be, in effect, identical in the context of EDA circuit analyses. Such circuit design elements that differ by 90° rotation and/or reflection image differences may exhibit the same performance, design, or thermal characteristics, and may thus be grouped together for purposes of EDA circuit analyses. Rotation/reflection-invariant clustering of such circuit images may thus increase the accuracy and efficiency of EDA circuit analyses.

In some implementations, the adapted loss function 310 may be configured to be invariant to the seven rotation and reflection invariant properties described above. In applying the adapted loss function 310 to the circuit image 402 and the circuit image 404, the image clustering engine 110 may apply, for each given invariant property of the invariant property set 230, the given image transformation that corresponds to the given invariant property to the first circuit image to obtain a set of transformed images. In FIG. 4, application of the adapted loss function 310 by image clustering engine 110 may include applying seven (7) image transformations to the circuit image 402, a respective image transformation for each rotation/reflection invariant property in the invariant property set 230. In FIG. 4, the image clustering engine 110 generates the set of transformed images 410, which includes seven (7) transformed circuit images 411-417, one for each invariant property of the invariant property set 230 as applied to the circuit image 402. For instance, transformed circuit image 411 may result from application of a 90° image rotation to the circuit image 402 (in this case, clockwise), transformed circuit image 412 may result from the application of a 180° image rotation, transformed circuit image 413 may result from the application of a 270° image rotation (in this case, clockwise), transformed circuit image 414 may result from application of a horizontal mirror image, transformed circuit image 415 may result from application of a horizontal mirror image of the 90-degree image rotation (e.g., a horizontal mirror image of the transformed circuit image 411), and so forth.

The image clustering engine 110 may apply image transformations to generate the transformed circuit images in any number of ways. Such image transformations may be vary based on the specific format that a circuit image takes. For instance, the image clustering engine 110 may receive input images in a particular image format (e.g., .jpeg, .png, .gif, etc.) and implement image transformation capabilities to perform the image transformations corresponding to applied invariant properties. In some instances, the image clustering engine 110 may represent (e.g., convert) circuit images into a matrix representation (e.g., a pixel map) with matrix values representing an RGB value, grayscale value, or a black/white binary value for given pixels or other portions of circuit images. In such instances, image rotations and reflections may be performed by the image clustering engine as matrix operations to rotate and/or reflect the matrix values corresponding to the invariant properties. In these ways and more, the image clustering engine 110 may apply image transformations to generate the set of transformed images 410.

To determine a cost measurement (e.g., a computed image difference) for the circuit images 402 and 404, the image clustering engine 110 may compute, through the adapted loss function 310, cost measurements between the circuit image 404 and each of the transformed circuit images 411-417 as well as the circuit image 402. In doing so, the adapted loss function 310 may access or implement any standard, conventional, or predetermined cost function to support optimization of a neural network for classifying circuit images. Cost functions of any type or implementation are contemplated herein for neural network optimizations or other applications of unsupervised learning processes. To support application of cost functions, the image clustering engine 110 may convert the circuit image 402, the circuit image 404, and the transformed circuit images 411-417 into neural network representations to support a difference comparison (e.g., cost measurement computations) by the adapted loss function 310. Converted formats may be specific to or controlled by neural network implementations used by the unsupervised learning component 220, e.g., as latent vector representations of images. As used herein, circuit images (including those shown in FIG. 4) may include any representation of a circuit portion, and may thus include neural network representations or other machine-learning representations generated or produced for application of machine-learning processes for EDA processes.

In FIG. 4, application of a cost function to compute cost measurements is illustrated through the LOSS ( ) function, which the adapted loss function 310 may apply eight (8) times between the circuit image 404 and the circuit image 402 as well as the seven transformed images 411-417 (not all instances of LOSS ( ) function applications are explicitly illustrated in FIG. 4). The image clustering engine 110 may determine the output of the adapted loss function 310 applied to the circuit image 402 and the circuit image 404 as a lowest cost measurement computed for the circuit image 402 and each of the transformed circuit images 411-417 as well as the circuit image 402. In FIG. 4, the adapted loss function 310 outputs a cost measurement with a value of 1, determined as the lowest cost measurement amongst the eight (8) computed cost measurements between the circuit image 404 and the circuit image 402 as well as each of the transformed circuit image 411-417. As used, herein, a "lowest" cost measurement may refer to a value that most corresponds to an unsupervised learning optimization goal (e.g., a lowest numerical value when the optimization goal is to minimize loss function outputs or when lower numerical values indicate increased image similarity between two input images).

In the particular example shown in FIG. 4, the computed cost measurement between the circuit image 404 and the transformed circuit image 411 is selected for output by the adapted loss function 310. This makes sense as the circuit image 402 is near-identical to the circuit image 404 except for a 90° image rotation, and thus ignoring the invariant property of a 90° image rotation would result in a decreased cost measurement (in this case, LOSS (transformed circuit image 411, circuit image 404)=1) as compared to a computed cost measurement between the circuit image 402 and circuit image 404 (as shown in the computed cost measurement of LOSS (circuit image 402, circuit image 404)=215).

In a broader sense, an adapted loss function 310 may support image comparisons of transformed images for each invariant property in an invariant property set 230. By determining a lowest computed cost measurement among input and transformed circuit images (e.g., when a neural network optimization is configured to minimize cost function outputs), the adapted loss function 310 implemented by the image clustering engine 110 may evaluate neural network weights based on a computed cost measurement among multiple transformed circuit images, selecting a computed cost measurement that may, in effect, minimize, reduce, or ignore at least one of the invariant properties via the applied image transformation. This may also be the case for loss functions that compute image similarity measures, and outputting a decreased/lowest cost measurement value may have the effect of reducing or eliminating the impact of images that differ by the image transformations of applied invariant properties.

For rotation and reflection-based invariant properties (such as those applied in the example shown in FIG. 4), the adapted loss function 310 may be configured to ignore rotation and reflection-based invariant properties in that the lowest computed cost measurement between the circuit image 404 and the circuit image 402 as well as the transformed circuit images 411-417 will necessarily consider the image transformations associated with the rotation and reflection-based invariant properties. The adapted loss function 310 may further select the computed cost measurement that most advances optimization of a neural network model or results in a closest similarity measure between two circuit images, thus reducing or ignoring the effect of the invariant properties as much as possible. Explained in yet another way, the rotation/reflection-based invariant properties in FIG. 4 may provide orientation-independent clustering of circuit images by considering transformed circuit images of each rotated/reflected orientation as specified in an invariant property set 230. Accordingly, the cost measurements computed for input circuit images and transformed circuit images may allow a neural network or unsupervised learning process to determine image differences aside from the invariant properties through adapted loss function output of a lowest computed cost measurement. Selection of the lowest computed cost requirement among input circuit images and transformed circuit images may, in effect, result in the outputting of a computed cost requirement (e.g., from a transformed circuit image) that minimizes the invariant properties to a greatest degree, instead focusing neural network optimization for clustering and pattern classifications based on image differences aside from the invariant properties.

In any of the ways described herein (according to any combination of features described herein), the image clustering engine 110, cluster provision engine 112, unsupervised learning component 220, the adapted loss function 310, or combinations thereof may support and implement invariant clustering according a specified set of invariant properties. Although illustrated distinctly in FIGS. 2-4, the image clustering engine 110, unsupervised learning component 220, invariant property set 230, and adapted loss function 310 may be implemented in combination (e.g., as a hardware-software combination in which features of each are implemented together).

In some implementations, the invariant property set 230 may be implemented or specified via hard-coded image transformations as part of an adapted loss function 310. Each image transformation applied by the adapted loss function to generate the set of transformed images 410 may correspond (and implicitly specify) a particular invariant property. For instance, an image translation coded into the adapted loss function 310 to apply a 90° clockwise image rotation to generate a transformed circuit image may, in effect, specify or identify a 90° clockwise image rotation invariant property to apply for invariant clustering. In such examples, updates, changes, configurations, additions, and other adjustment of applicable invariant properties may be effectuated through updates to the image transformations coded into and applied by the adapted loss function 310. In some implementations, the invariant property set 230 may be separately maintained (e.g., as a user-configurable list), and the image clustering engine 110 may dynamically utilize and apply image transformation techniques according to specific invariant properties specified in the invariant property set 230.

Figure 5:
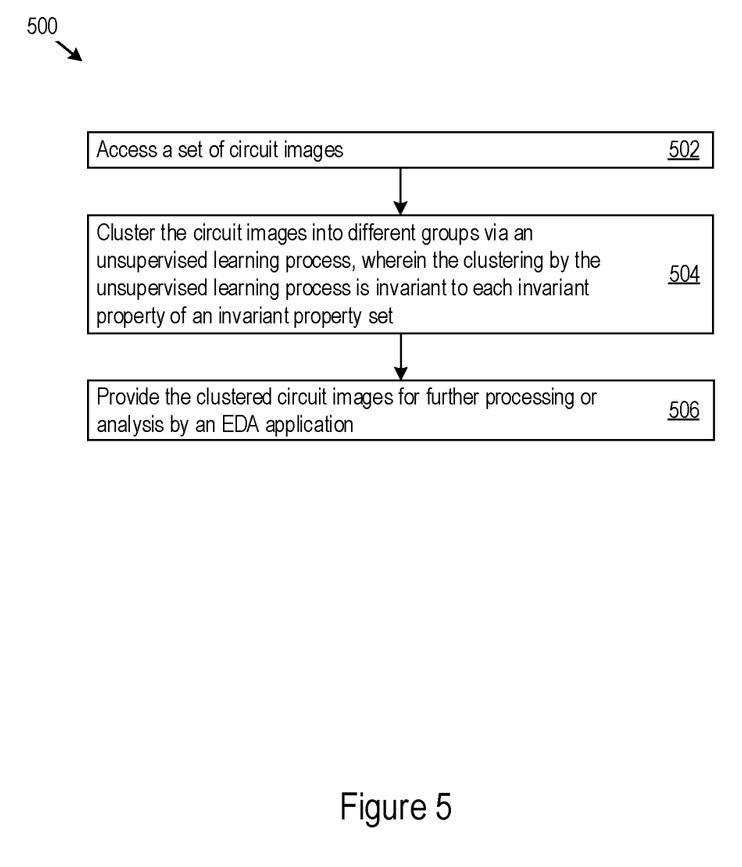
FIG. 5 shows an example of logic that a system may implement to support invariant property-based clustering of circuit images for EDA applications.

FIG. 5 shows an example of logic 500 that a system may implement to support invariant property-based clustering of circuit images for EDA applications. In some examples, the computing system 100 may implement the logic 500 as hardware, executable instructions stored on a machine-readable medium, or as a combination of both. The computing system 100 may implement the logic 500 via the image clustering engine 110 and the cluster provision engine 112, for example, through which the computing system 100 may perform or execute the logic 500 as a method to support invariant property-based clustering of circuit images for EDA applications. However, other implementation options are possible.

In implementing the logic 500, the image clustering engine 110 may accessing a set of circuit images (502) and cluster the circuit images into different groups via an unsupervised learning process, wherein the clustering by the unsupervised learning process is invariant to each invariant property of an invariant property set (504). A given invariant property in the invariant property set may corresponds to a given image transformation, the invariant properties in the invariant property set may be discrete, and a total number of invariant properties in the invariant property set may be finite. In implementing the logic 500, the cluster provision engine 112 may provide the clustered circuit images for further processing or analysis by an EDA application.

While example features are shown and described through FIG. 5, the logic 500 may include any number of additional or alternative steps as well. The logic 500 may additionally or alternatively implement any other features described herein, for example any number of invariant clustering features with respect to the image clustering engine 110, cluster provision engine 112, or combinations of both.

Figure 6:
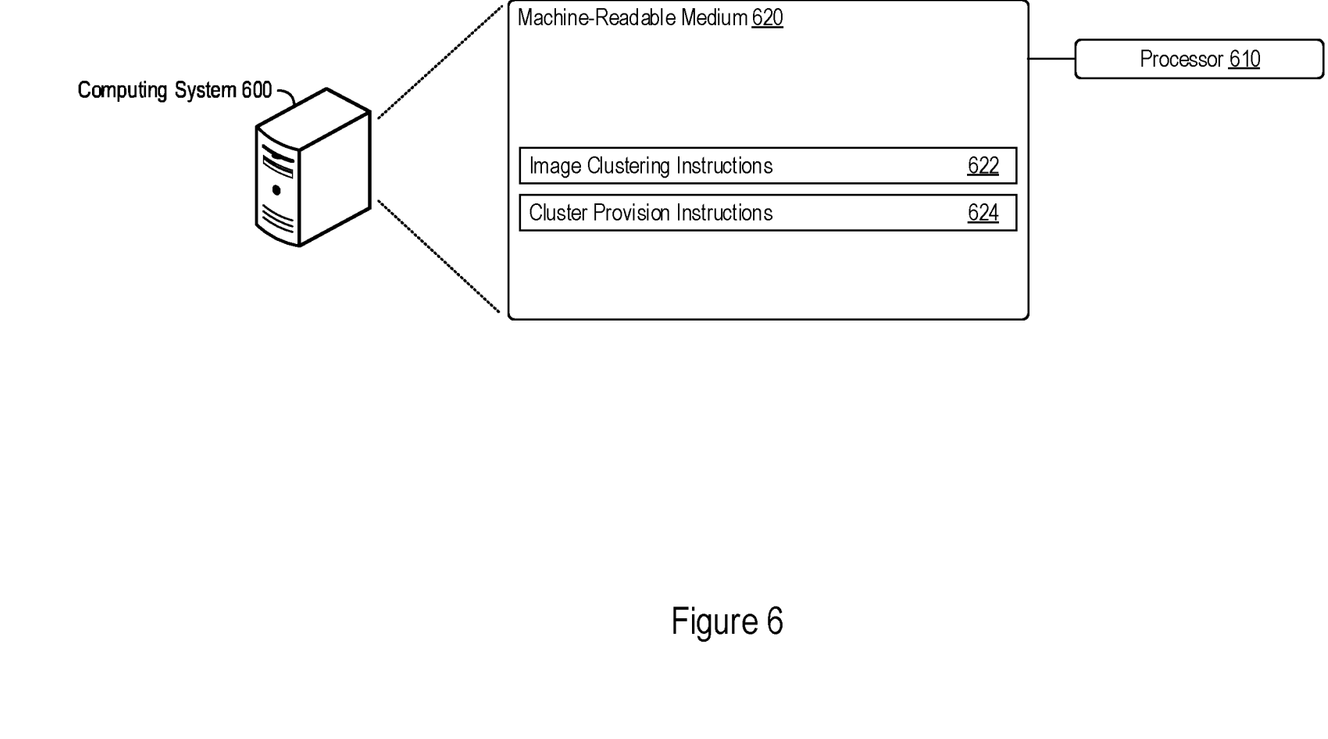
FIG. 6 shows an example of a computing system that supports invariant property-based clustering of circuit images for EDA applications.

FIG. 6 shows an example of a computing system 600 that supports invariant property-based clustering of circuit images for EDA applications. The computing system 600 may include a processor 610, which may take the form of a single processor or multiple processors. The processor(s) 610 may include a central processing unit (CPU), microprocessor, or any hardware device suitable for executing instructions stored on a machine-readable medium. The computing system 600 may include a machine-readable medium 620. The machine-readable medium 620 may take the form of any non-transitory electronic, magnetic, optical, or other physical storage device that stores executable instructions, such as the image clustering instructions 622 and cluster provision instructions 624 shown in FIG. 6. As such, the machine-readable medium 620 may be, for example, random access memory (RAM) such as a dynamic RAM (DRAM), flash memory, spin-transfer torque memory, an electrically-erasable programmable read-only memory (EEPROM), a storage drive, an optical disk, and the like.

The computing system 600 may execute instructions stored on the machine-readable medium 620 through the processor 610. Executing the instructions may cause the computing system 600 to perform any of the invariant clustering features described herein, including according to any of the features of the image clustering engine 110, the cluster provision engine 112, or combinations of both.

For example, execution of the image clustering instructions 622 by the processor 610 may cause the computing system 600 to access a set of circuit images and cluster the circuit images into different groups via an unsupervised learning process, wherein the clustering by the unsupervised learning process is invariant to each invariant property of an invariant property set. A given invariant property in the invariant property set may corresponds to a given image transformation, the invariant properties in the invariant property set may be discrete, and a total number of invariant properties in the invariant property set may be finite. Execution of the cluster provision instructions 624 may cause the computing system 600 to provide the clustered circuit images for further processing or analysis by an EDA application.

The systems, methods, devices, and logic described above, including the image clustering engine 110 and the cluster provision engine 112, may be implemented in many different ways in many different combinations of hardware, logic, circuitry, and executable instructions stored on a machine-readable medium. For example, the image clustering engine 110, cluster provision engine 112, or both, may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. A product, such as a computer program product, may include a storage medium and machine readable instructions stored on the medium, which when executed in an endpoint, computer system, or other device, cause the device to perform operations according to any of the description above, including according to any features of the image clustering engine 110, the cluster provision engine 112, or combinations of both.

The processing capability of the systems, devices, and engines described herein, including the image clustering engine 110 and the cluster provision engine 112, may be distributed among multiple system components, such as among multiple processors and memories, optionally including multiple distributed processing systems or cloud/network elements. Parameters, databases, and other data structures may be separately stored and managed, may be incorporated into a single memory or database, may be logically and physically organized in many different ways, and may implemented in many ways, including data structures such as linked lists, hash tables, or implicit storage mechanisms. Programs may be parts (e.g., subroutines) of a single program, separate programs, distributed across several memories and processors, or implemented in many different ways, such as in a library (e.g., a shared library).

While various examples have been described above, many more implementations are possible.

The invention claimed is:

1. A method comprising:
by a computing system:
    accessing a set of circuit images;
    clustering the circuit images into different groups via an unsupervised learning process, wherein the clustering by the unsupervised learning process is invariant to each invariant property of an invariant property set, and wherein:
        a given invariant property in the invariant property set corresponds to a given image transformation;
        the invariant properties in the invariant property set are discrete; and
        a total number of invariant properties in the invariant property set is finite; and
    providing the clustered circuit images for further processing or analysis by an electronic design automation (EDA) application.

2. The method of claim 1, wherein clustering comprises:
    comparing, via the unsupervised learning process, a first circuit image and a second circuit image, wherein the first circuit image is identical to the second circuit image when an image transformation corresponding to one of the invariant properties of the invariant property set is applied to the second image; and
    grouping the first circuit image and the second circuit image into a same group in the clustered circuit images.

3. The method of claim 2, wherein comparing comprises applying an adapted loss function to the first circuit image and the second circuit image,
    wherein the adapted loss function is configured to compute a cost measurement between circuit images, and
    wherein the adapted loss function is further configured to output a decreased cost measurement between circuit images that differ by any of the image transformations corresponding to the invariant properties of the invariant property set.

4. The method of claim 3, wherein applying the adapted loss function to the first circuit image and the second circuit image comprises:
    applying, for each given invariant property of the invariant property set, the given image transformation that corresponds to the given invariant property to the first circuit image to obtain a set of transformed images, wherein the set of transformed images comprises a transformed first circuit image for each of the invariant properties;

computing, through the adapted loss function, cost measurements between the second circuit image and each of the transformed first circuit images as well as the first circuit image; and determining the output of the adapted loss function applied to the first circuit image and the second circuit image as a lowest cost measurement computed for the second circuit image and each of the transformed first circuit images as well as the first circuit image.

5. The method of claim 3, wherein applying the adapted loss function to the first circuit image and the second circuit image comprises converting the first circuit image and the second circuit image into neural network representations to support a difference comparison by the adapted loss function.

6. The method of claim 1, wherein the invariant properties comprise a 90-degree image rotation, a 180-degree image rotation, a 270-degree image rotation, a horizontal mirror image, a horizontal mirror image of the 90-degree image rotation, a horizontal mirror image of the 180-degree image rotation, and a horizontal mirror image of the 270-degree image rotation.

7. The method of claim 1, wherein the circuit images comprises different portions of:
a circuit design, a logical circuit layout, a physical circuit layout, one or more lithographic masks for manufacture of a circuit layer of a circuit design, a thermal map of a circuit, or a printed circuit layout.

8. The method of claim 1, wherein the total number of invariant properties in the invariant property set is limited to a predetermined threshold.

9. A system comprising:
an image clustering engine configured to:
access a set of circuit images;
cluster the circuit images into different groups via an unsupervised learning process, wherein clustering by the unsupervised learning process is invariant to each invariant property of an invariant property set, and wherein:
a given invariant property in the invariant property set corresponds to a given image transformation;
the invariant properties in the invariant property set are discrete; and
a total number of invariant properties in the invariant property set is finite; and
a cluster provision engine configured to provide the clustered circuit images for further processing or analysis by an electronic design automation (EDA) application.

10. The system of claim 9, wherein the image clustering engine is configured to cluster the circuit images by:
comparing, via the unsupervised learning process, a first circuit image and a second circuit image, wherein the first circuit image is identical to the second circuit image when an image transformation corresponding to one of the invariant properties of the invariant property set is applied to the second image; and
grouping the first circuit image and the second circuit image into a same group in the clustered circuit images.

11. The system of claim 10, wherein the image clustering engine is configured to compare the first circuit image and the second circuit image by applying an adapted loss function to the first circuit image and the second circuit image, wherein the adapted loss function is configured to compute a cost measurement between circuit images, and wherein the adapted loss function is further configured to output a decreased cost measurement between circuit images that differ by any of the image transformations corresponding to the invariant properties of the invariant property set.

12. The system of claim 11, wherein the image clustering engine is configured to apply the adapted loss function to the first circuit image and the second circuit image by:
applying, for each given invariant property of the invariant property set, the given image transformation that corresponds to the given invariant property to the first circuit image to obtain a set of transformed images, wherein the set of transformed images comprises a transformed first circuit image for each of the invariant properties;
computing, via the adapted loss function, cost measurements between the second circuit image and each of the transformed first circuit images as well as the first circuit image; and
determining the output of the adapted loss function applied to the first circuit image and the second circuit image as a lowest cost measurement computed for the second circuit image and each of the transformed first circuit images as well as the first circuit image.

13. The system of claim 11, wherein the image clustering engine is configured to apply the adapted loss function to the first circuit image and the second circuit image by converting the first circuit image and the second circuit image into neural network representations to support a difference comparison by the adapted loss function.

14. The system of claim 9, wherein the invariant properties comprise a 90-degree image rotation, a 180-degree image rotation, a 270-degree image rotation, a horizontal mirror image, a horizontal mirror image of the 90-degree image rotation, a horizontal mirror image of the 180-degree image rotation, and a horizontal mirror image of the 270-degree image rotation.

15. A non-transitory machine-readable medium comprising instructions that, when executed by a processor, cause a computing system to:
access a set of circuit images;
cluster the circuit images into different groups via an unsupervised learning process, wherein clustering by the unsupervised learning process is invariant to each invariant property of an invariant property set, and wherein:
a given invariant property in the invariant property set corresponds to a given image transformation;
the invariant properties in the invariant property set are discrete; and
a total number of invariant properties in the invariant property set is finite; and
provide the clustered circuit images for further processing or analysis by an electronic design automation (EDA) application.

16. The non-transitory machine-readable medium of claim 15, wherein the instructions, when executed, cause the computing system to cluster the circuit images by:
comparing, via the unsupervised learning process, a first circuit image and a second circuit image, wherein the first circuit image is identical to the second circuit image when an image transformation corresponding to one of the invariant properties of the invariant property set is applied to the second image; and grouping the first circuit image and the second circuit image into a same group in the clustered circuit images.

17. The non-transitory machine-readable medium of claim 16, wherein the instructions, when executed, cause the computing system to compare the first circuit image and the second circuit image by applying an adapted loss function to the first circuit image and the second circuit image,
wherein the adapted loss function is configured to compute a cost measurement between circuit images, and
wherein the adapted loss function is further configured to output a decreased cost measurement between circuit images that differ by any of the image transformations corresponding to the invariant properties of the invariant property set.

18. The non-transitory machine-readable medium of claim 17, wherein the instructions, when executed, cause the computing system to apply the adapted loss function to the first circuit image and the second circuit image by:
applying, for each given invariant property of the invariant property set, the given image transformation that corresponds to the given invariant property to the first circuit image to obtain a set of transformed images, wherein the set of transformed images comprises a transformed first circuit image for each of the invariant properties;
computing, via the adapted loss function, cost measurements between the second circuit image and each of the transformed first circuit images as well as the first circuit image; and
determining the output of the adapted loss function applied to the first circuit image and the second circuit image as a lowest cost measurement computed for the second circuit image and each of the transformed first circuit images as well as the first circuit image.

19. The non-transitory machine-readable medium of claim 17, wherein the instructions, when executed, cause the computing system to apply the adapted loss function to the first circuit image and the second circuit image by converting the first circuit image and the second circuit image into neural network representations to support a difference comparison by the adapted loss function.

20. The non-transitory machine-readable medium of claim 15, wherein the invariant properties comprise a 90-degree image rotation, a 180-degree image rotation, a 270-degree image rotation, a horizontal mirror image, a horizontal mirror image of the 90-degree image rotation, a horizontal mirror image of the 180-degree image rotation, and a horizontal mirror image of the 270-degree image rotation.

* * * * *